United States Patent
Matsusue

(10) Patent No.: US 9,275,928 B2
(45) Date of Patent: *Mar. 1, 2016

(54) SEMICONDUCTOR PACKAGE

(75) Inventor: Akihiro Matsusue, Nagasaki (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 14/371,021

(22) PCT Filed: May 1, 2012

(86) PCT No.: PCT/JP2012/061536
§ 371 (c)(1),
(2), (4) Date: Jul. 8, 2014

(87) PCT Pub. No.: WO2013/164876
PCT Pub. Date: Nov. 7, 2013

(65) Prior Publication Data
US 2014/0328361 A1    Nov. 6, 2014

(51) Int. Cl.
*H01L 23/14* (2006.01)
*H01L 21/00* (2006.01)
*H01L 23/373* (2006.01)
*H01S 5/022* (2006.01)
*H01S 5/024* (2006.01)
(Continued)

(52) U.S. Cl.
CPC ........ *H01L 23/3731* (2013.01); *H01L 23/3735* (2013.01); *H01L 31/024* (2013.01); *H01S 5/02212* (2013.01); *H01S 5/02276* (2013.01); *H01S 5/02469* (2013.01); *H01L 2224/45139* (2013.01); *H01L 2224/48091* (2013.01); *H01S 5/02236* (2013.01); *H01S 5/06226* (2013.01); *H01S 5/183* (2013.01)

(58) Field of Classification Search
CPC ........................ H01L 23/3731; H01L 23/3735
USPC ............................ 438/121–125; 257/700–707
See application file for complete search history.

(56) References Cited

U.S. PATENT DOCUMENTS

| 5,506,755 A | 4/1996 | Miyagi et al. |
| 6,518,501 B1 * | 2/2003 | Kawahara ............. H01L 23/055 174/536 |

(Continued)

FOREIGN PATENT DOCUMENTS

| JP | 4-286179 A | 10/1992 |
| JP | 6-13491 A | 1/1994 |

(Continued)

OTHER PUBLICATIONS

European Patent Office; Extended Search Report in European Patent Application No. 12 876 054.3 (Jun. 1, 2015).

(Continued)

*Primary Examiner* — Calvin Lee
(74) *Attorney, Agent, or Firm* — Leydig, Voit & Mayer, Ltd.

(57) ABSTRACT

A metallic ring is located on a multilayer ceramic substrate. An optical semiconductor laser is located on the multilayer ceramic substrate, inside the metallic ring. A metallic cap with a window is joined to the metallic ring. The metallic cap covers the optical semiconductor laser. An external heat sink is joined to an external side surface of the metallic cap. These features make it possible to improve high-frequency characteristics, producibility, and heat dissipation.

9 Claims, 4 Drawing Sheets

(51) Int. Cl.
   *H01L 31/024* (2014.01)
   *H01S 5/062* (2006.01)
   *H01S 5/183* (2006.01)

(56) References Cited

U.S. PATENT DOCUMENTS

| | | | |
|---|---|---|---|
| 9,054,484 B2 * | 6/2015 | Matsusue | H01S 5/02248 |
| 2005/0129373 A1 | 6/2005 | Zheng | |
| 2008/0150065 A1 | 6/2008 | Oda | |
| 2009/0092168 A1 | 4/2009 | Yamauchi et al. | |
| 2010/0316338 A1 | 12/2010 | Shono | |
| 2011/0222567 A1 | 9/2011 | Scofet et al. | |

FOREIGN PATENT DOCUMENTS

| | | |
|---|---|---|
| JP | 10-13066 A | 1/1998 |
| JP | 10-112520 A | 4/1998 |
| JP | 2003-163382 A | 6/2003 |
| JP | 2005-86094 A | 3/2005 |
| JP | 2005-285234 A | 10/2005 |
| JP | 2008-159869 A | 7/2008 |
| JP | 2008-235744 A | 10/2008 |
| JP | 2011-2477 A | 1/2011 |
| JP | 2011-18800 A | 1/2011 |
| JP | 2011-243600 A | 12/2011 |
| JP | 2011-249447 A | 12/2011 |
| KR | 10-2008-0059514 A | 6/2008 |
| TW | 200929201 A | 7/2009 |

OTHER PUBLICATIONS

Taiwan Patent Office; Office Action in corresponding Taiwanese patent application No. 101121057 (Nov. 21, 2014).
Japanese Patent Office; Office Action in corresponding Japanese patent application (Mar. 31, 2015).
International Bureau of WIPO, English translation of International Search Report in International Patent Application No. PCT/JP2012/061536 (Nov. 26, 2014).
Taiwanese Patent Office; Office Action in Corresponding Taiwanese Patent Application No. 101121057 (Apr. 28, 2014).
Korean Patent Office; Office Action in Korean Patent Application No. 10-2014-7029410 (Nov. 17, 2015).

* cited by examiner

HEAT FLOW

SEMICONDUCTOR PACKAGE

This application is a continuation of U.S. patent application Ser. No. 14/373,662, filed on Apr. 4, 2012, now U.S. Pat. No. 9,054,484 issued Jun. 9, 2015, the disclosure of which is incorporated herein in its entirety by reference.

TECHNICAL FIELD

The present invention relates to a semiconductor package for optical communication.

BACKGROUND ART

Conventional semiconductor packages for optical communication include metal packages and CAN packages. A metal package is a combination of a multilayer ceramic substrate and a metallic box. A CAN package has a metal plate, a metallic rod passed through an open hole in the metal plate and hermetically sealed and insulated with glass, and a welded cap with a window.

The metal package has an excellent high-frequency characteristic because of use of the multilayer ceramic substrate. The metal package, however, has a complicated structure and a large number of parts and is high in cost. Also, because of its box form, parts can be mounted only from the opening side (upper side) before the package is closed.

In the case of the CAN package, parts can be mounted from all directions onto the upper surface of the metal plate, and the metal plate and the cap can be joined to each other in an instance by electric welding. The CAN package therefore has high producibility. However, since the lead for supplying a signal is fixed by glass sealing on the metal plate, it is difficult to achieve impedance matching thereat and the CAN package is inferior in high-frequency characteristic.

A semiconductor package has been proposed which has an optical semiconductor element mounted in a recess in an upper surface of a multilayer ceramic substrate and covered with a metallic cap with a window (see, for example, Patent Literature 1)

CITATION LIST

Patent Literature

Patent Literature 1: Japanese Patent Laid-Open No. 2003-163382

SUMMARY OF INVENTION

Technical Problem

The material of the multilayer ceramic substrate is alumina ceramic. This means that the multilayer ceramic substrate has lower heat dissipation in comparison with the CAN package whose base portion is made of a metal.

The present invention has been achieved to solve the above-described problem, and an object of the present invention is to obtain a semiconductor package capable of being improved in high-frequency characteristic, producibility and heat dissipation.

Means for Solving the Problems

A semiconductor package according to the present invention includes a multilayer ceramic substrate; a metallic ring on the multilayer ceramic substrate; an optical semiconductor element on the multilayer ceramic substrate inside the metallic ring; a metallic cap with a window, the metallic cap joined to the metallic ring and covering the optical semiconductor element; and an external heat sink joined to an external side surface of the metallic cap.

Advantageous Effects of Invention

The present invention makes it possible to improve high-frequency characteristic, producibility and heat dissipation.

DESCRIPTION OF EMBODIMENTS

A semiconductor package according to the embodiments of the present invention will be described with reference to the drawings. The same components will be denoted by the same symbols, and the repeated description thereof may be omitted.

Embodiment 1

Figure 1:
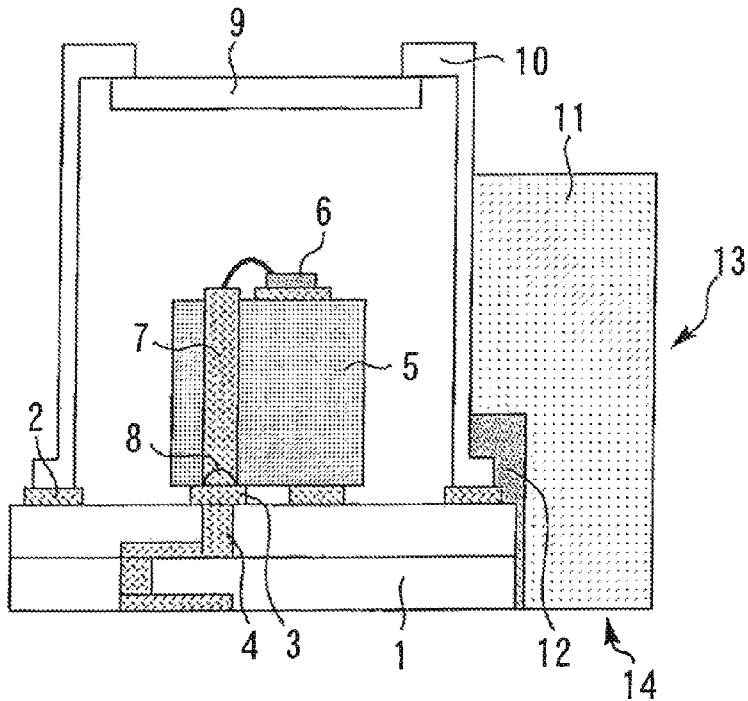
FIG. 1 is a side view showing parts inside a cap of the semiconductor package according to Embodiment 1 of the present invention.

FIG. 1 is a side view showing parts inside a cap of the semiconductor package according to Embodiment 1 of the present invention. A metallic ring 2 made of Fe or Ni for example is provided on a multilayer ceramic substrate 1 formed of alumina or the like. An electrode 3 is provided on the multilayer ceramic substrate 1 inside the metallic ring 2. The electrode 3 is connected to a via 4 formed through the multilayer ceramic substrate 1. An internal heat sink 5 is provided on the multilayer ceramic substrate 1 inside the metallic ring 2.

A surface-emitting type of semiconductor laser 6 is provided on the internal heat sink 5. A surface-receiving type of light receiving element may be used in place of the surface-emitting type of semiconductor laser 6. Wiring 7 is provided on a surface of the internal heat sink 5. The semiconductor laser 6 and the wiring 7 are connected to each other by a wire.

The internal heat sink 5 is placed on the multilayer ceramic substrate 1 so that a portion of the electrode 3 and a portion of the wiring 7 are superposed on each other. The portion of the electrode 3 and the portion of the wiring 7 are joined to each other by an electrically conductive joint material 8 such as solder or an electrically conductive resin. Because of this nonuse of wire bonding, a high-frequency transmission loss at the joint between the electrode 3 and the wiring 7 can be reduced to improve a high-frequency characteristic. Since the need for a wire bonding step can be eliminated, the producibility can be improved.

A metallic cap 10 with a glass window 9 is electrically welded to the metallic ring 2. The metallic cap 10 is thinly formed of a Fe or Fe—Ni alloy. The metallic cap 10 covers the internal heat sink 5 and the semiconductor laser 6. An external heat sink 11 is joined to an external side surface of the metallic cap 10. A gap therebetween is filled with an adhesive 12 or solder. The gap therebetween may be filled with heat sink grease or the like after the metallic cap 10 and the external heat sink 11 have been welded to each other.

The external heat sink 11 extends to a lower surface of the multilayer ceramic substrate 1. The external heat sink 11 has flat joint surfaces 13 and 14 to be joined to an external frame. The flat joint surface 13 exists at a side surface of the external heat sink 11. The flat joint surface 14 exists at the lower surface side of the multilayer ceramic substrate 1.

Figure 2:
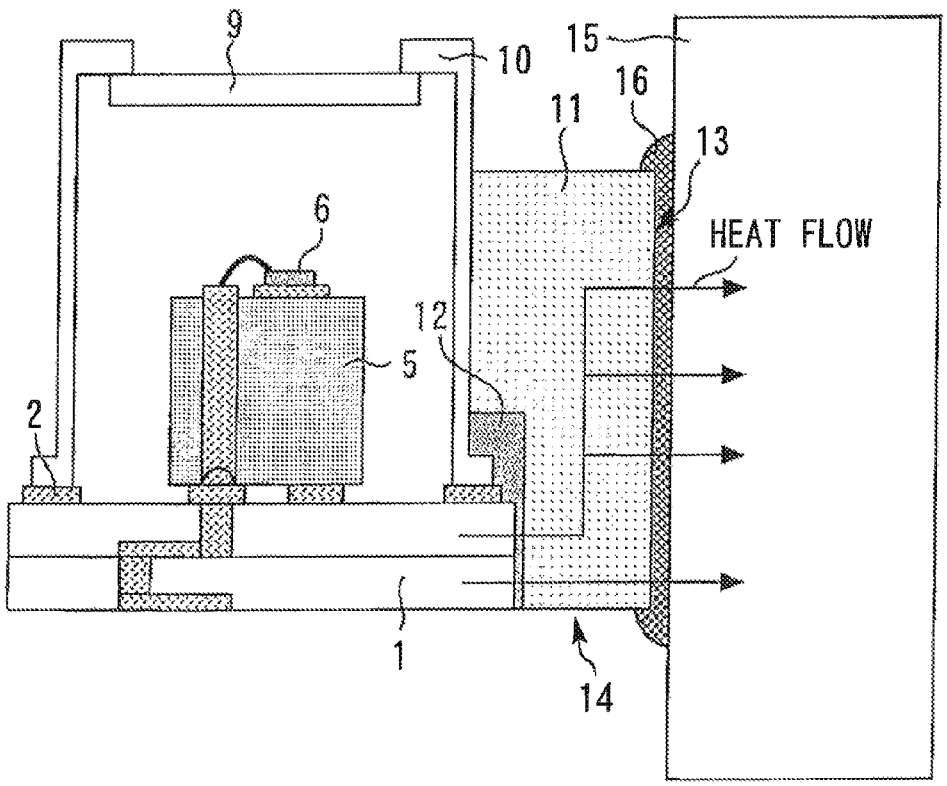
FIGS. 2 and 3 are sectional views each showing a state where the external heat sink of the semiconductor package according to Embodiment 1 of the present invention is joined to an external frame.
Figure 3:
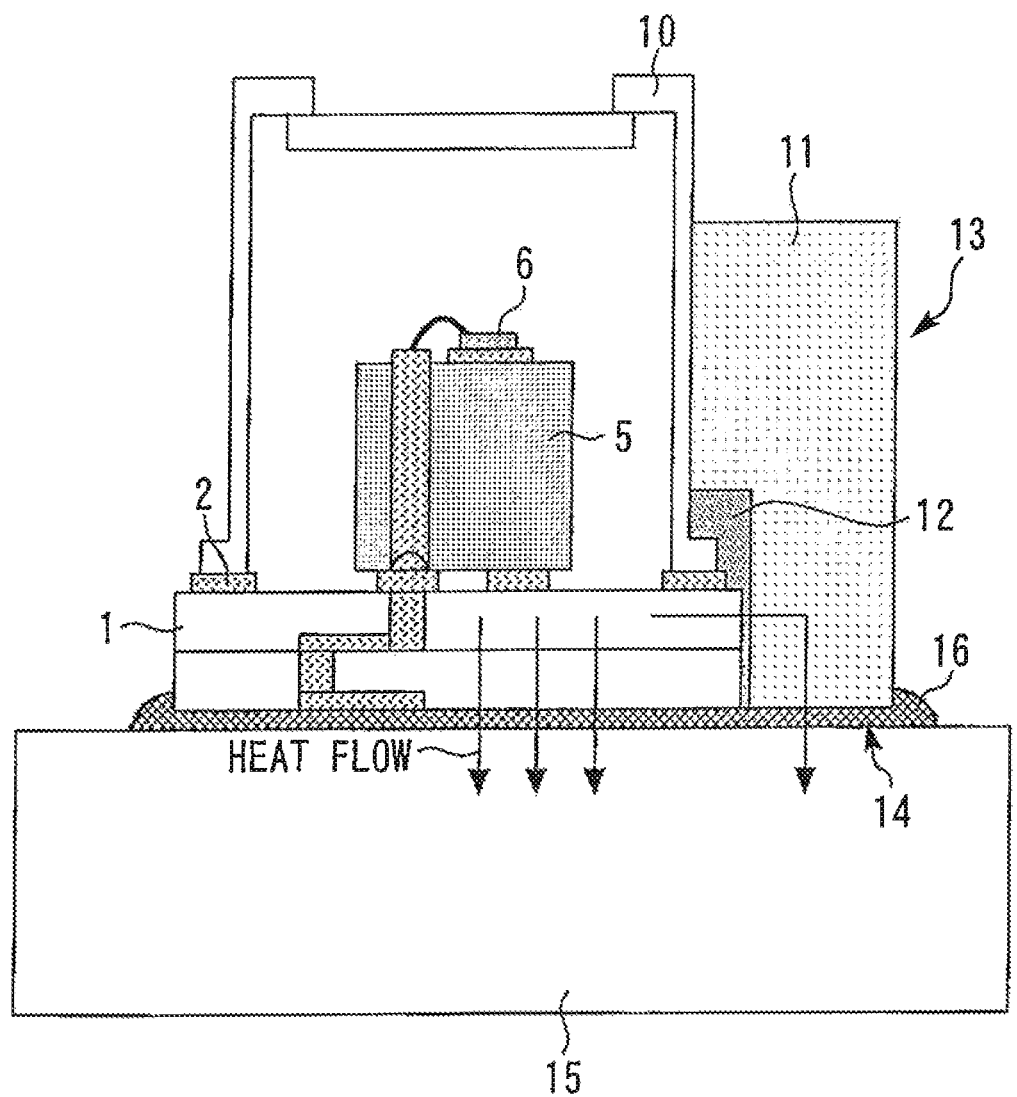

FIGS. 2 and 3 are sectional views each showing a state where the external heat sink of the semiconductor package according to Embodiment 1 of the present invention is joined to an external frame. Referring to FIG. 2, the flat joint surface 13, which is a side surface of the external heat sink 11, is joined to a frame 15 at a customer's site. Referring to FIG. 3, the flat joint surface 14, which is a lower surface of the external heat sink 11 is joined to the frame 15 at a customer's site. The gap between the external heat sink 11 and the frame 15 is filled with heat sink grease 16 or a soft heat sink sheet. Heat generated from the semiconductor laser 6 is released to the external frame 15 through the internal heat sink 5, the multilayer ceramic substrate 1, the metallic ring 2, the metallic cap 10 and the external heat sink 11.

In the present embodiment, an improvement in high-frequency characteristic can be achieved by using the multilayer ceramic substrate 1. Also, the metallic ring 2 on the multilayer ceramic substrate 1 and the metallic cap 10 can be electrically welded to each other in an instant. There are no obstacles such as side walls on the multilayer ceramic substrate 1 before the metallic cap 10 is welded. Therefore, components including the semiconductor laser 6 can easily be mounted, thus improving the producibility.

The metallic cap 10 itself also functions as a kind of a heat sink, but its heat dissipation effect is low because the material thereof is thin. Contrarily, in the present embodiment, because the external heat sink 11 is welded to the metallic cap 10, the heat dissipation effect can be improved.

Figure 4:
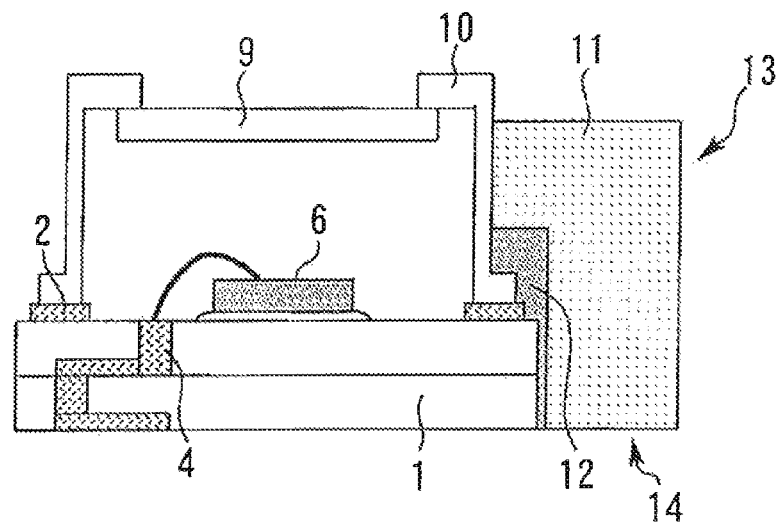
FIG. 4 is a side view showing parts inside the cap in a modified example 1 of the semiconductor package according to Embodiment 1 of the present invention.

FIG. 4 is a side view showing parts inside the cap in a modified example 1 of the semiconductor package according to Embodiment 1 of the present invention. In the modified example 1, the surface-emitting type of semiconductor laser 6 (or a surface-receiving type of light receiving element) is directly mounted on the multilayer ceramic substrate 1. Even in such a case, where the internal heat sink 5 is removed, the same effect as that described above can be obtained.

Figure 5:
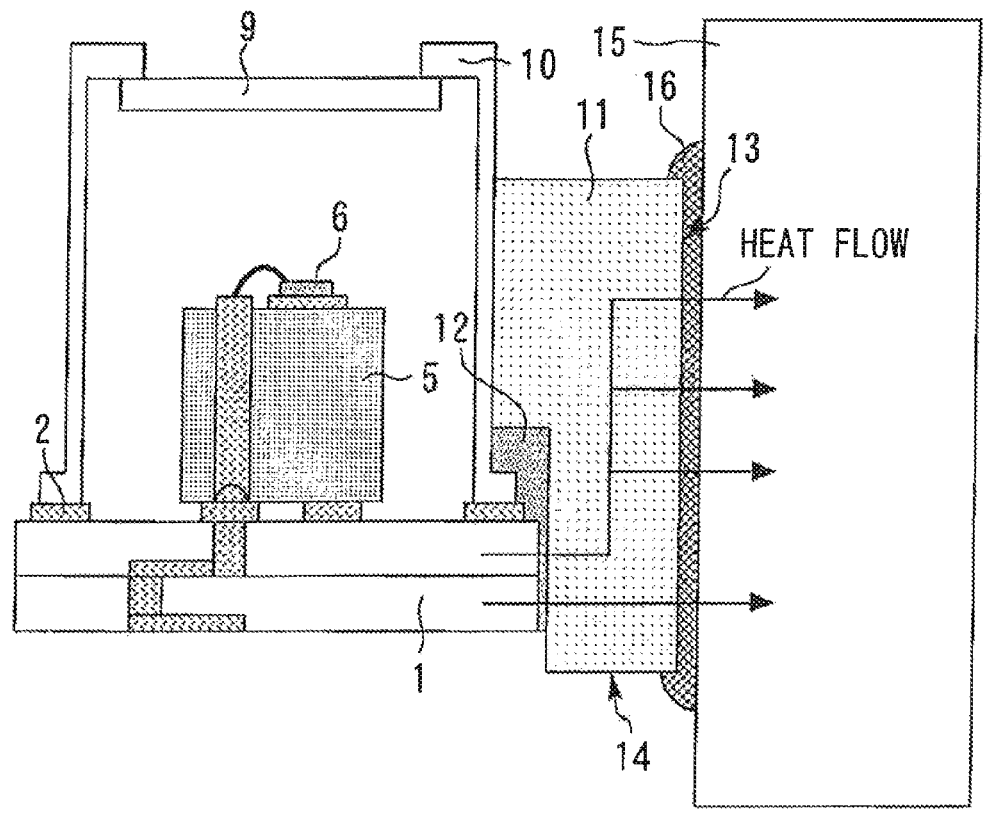
FIG. 5 is a sectional view showing a state where the external heat sink in a modified example 2 of the semiconductor package according to Embodiment 1 of the present invention is joined to an external frame.

FIG. 5 is a sectional view showing a state where the external heat sink in a modified example 2 of the semiconductor package according to Embodiment 1 of the present invention is joined to an external frame. In a case where the flat joint surface 13, which is a side surface of the external heat sink 11, is joined to the frame 15 at a customer's site, it is not required that the lower surface of the external heat sink 11 and the lower surface of the multilayer ceramic substrate 1 be flush with each other. In the modified example 2, these surfaces are not made flush with each other; the heat dissipation effect is improved by increasing the size of the external heat sink 11.

Embodiment 2

Figure 6:
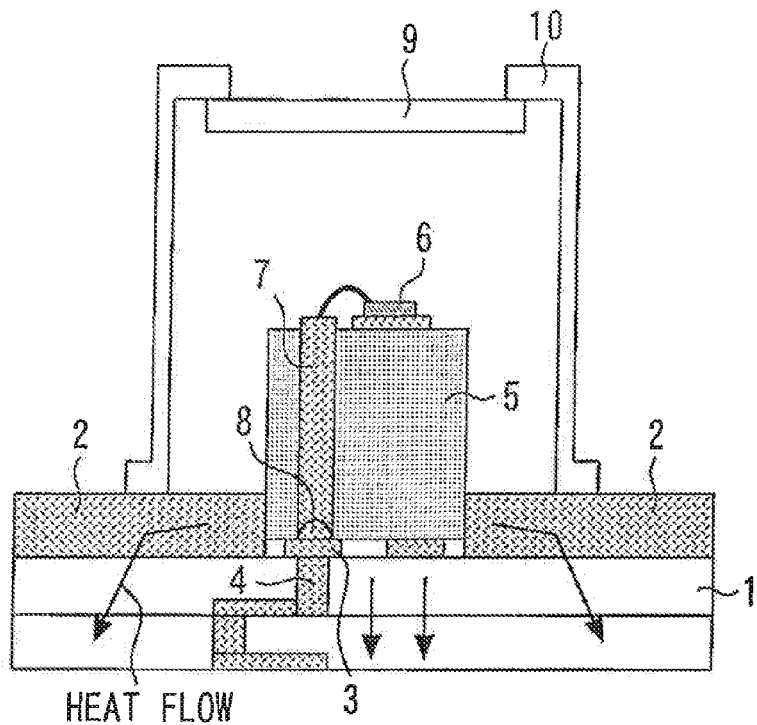
FIG. 6 is a side view showing parts inside a cap of a semiconductor package according to Embodiment 2 of the present invention.

FIG. 6 is a side view showing parts inside a cap of a semiconductor package according to Embodiment 2 of the present invention. In the present embodiment, the metallic ring 2 is made thicker than the electrode 3. The effect of heat dissipation by release of heat from the product side surfaces can be improved in this way.

Also, an inner end portion of the metallic ring 2 is in contact with the internal heat sink 5. This construction enables heat to be conducted from the internal heat sink 5 to the metallic ring 2 having high heat conductivity instead of being conducted through the multilayer ceramic substrate 1 having low heat conductivity. The heat dissipation effect can thereby be further improved.

The outer end portion of the metallic ring 2 is made flush with the outer end portion of the multilayer ceramic substrate 1. The heat dissipation effect can be further improved by increasing the area of the metallic ring 2 so that it is equal to that of the multilayer ceramic substrate 1.

Embodiment 3

Figure 7:
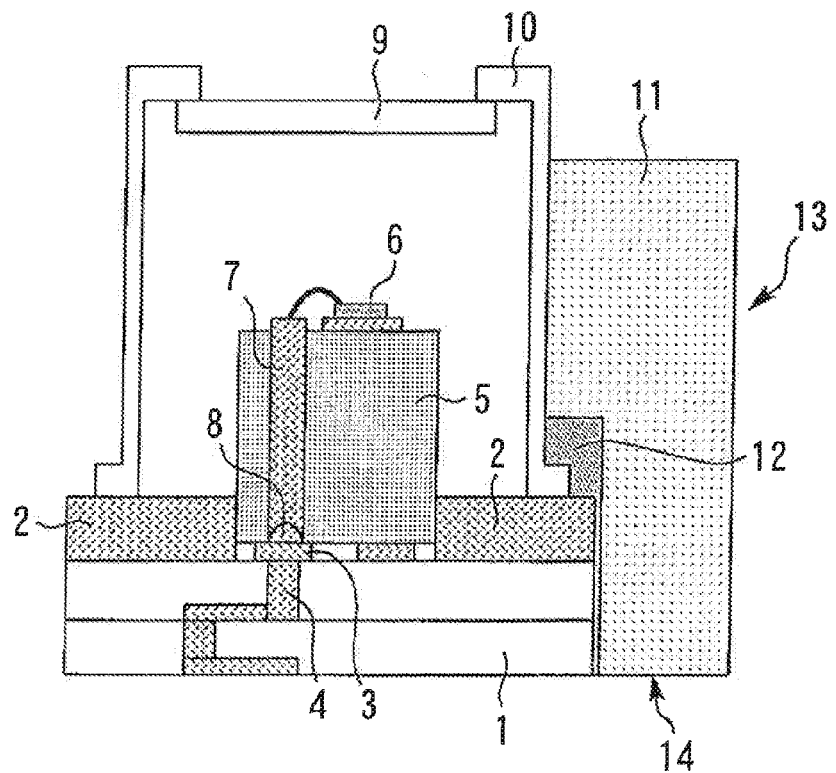
FIG. 7 is a side view showing parts inside a cap of a semiconductor package according to Embodiment 3 of the present invention.

FIG. 7 is a side view showing parts inside a cap of a semiconductor package according to Embodiment 3 of the present invention. In the present embodiment, the same external heat sink 11 as that in Embodiment 1 is added to the arrangement according to Embodiment 2. The external heat sink 11 is joined to an external side surface of the metallic cap 10 and to an outer end portion of the metallic ring 2. The heat dissipation effect can thereby be further improved.

In Embodiments 1 to 3, it is preferable to use AlN higher in heat conductivity than alumina as the material of the multilayer ceramic substrate 1. AlN has heat conductivity eight times or more higher than that of alumina. A semiconductor package improved in heat dissipation can therefore be obtained by using AlN.

In the case where the optical semiconductor element is the semiconductor laser 6, the glass window 9 may be replaced with a lens. Light emitted from the semiconductor laser 6 diffuses with the distance from the semiconductor laser 6 but can be condensed by the lens. The optical coupling efficiency can thereby be improved.

DESCRIPTION OF SYMBOLS 1 multilayer ceramic substrate
2 metallic ring
3 electrode
5 internal heat sink
6 semiconductor laser (optical semiconductor element)
7 wiring
9 glass window (window)
10 metallic cap
11 external heat sink
13,14 flat joint surface
15 frame

The invention claimed is:
1. A semiconductor package comprising:
a multilayer ceramic substrate;
a metallic ring located on the multilayer ceramic substrate;
an internal heat sink located on the multilayer ceramic substrate and inside the metallic ring;

an optical semiconductor element located on the internal heat sink; and a metallic cap with a window, wherein
the metallic cap is joined to the metallic ring and covers the optical semiconductor element, and
an inner end of the metallic ring is in contact with the internal heat sink.

2. The semiconductor package according to claim 1, wherein an outer end of the metallic ring is flush with an outer end of the multilayer ceramic substrate.

3. The semiconductor package according to claim 1, further comprising an external heat sink joined to an outer end of the metallic ring.

4. A semiconductor package comprising:
a multilayer ceramic substrate;
a metallic ring located on the multilayer ceramic substrate;
an optical semiconductor element located on the multilayer ceramic substrate and inside the metallic ring;
a metallic cap with a window, wherein the metallic cap is joined to the metallic ring and covers the optical semiconductor element; and
an external heat sink joined to an external side surface of the metallic cap.

5. The semiconductor package according to claim 4, wherein the external heat sink has a flat joint surface for joining to an external frame.

6. The semiconductor package according to claim 5, wherein the external heat sink extends to a lower surface of the multilayer ceramic substrate, and
the flat joint surface is located at a lower surface side of the multilayer ceramic substrate.

7. A semiconductor package comprising:
a multilayer ceramic substrate;
a metallic ring located on the multilayer ceramic substrate;
an electrode located on the multilayer ceramic substrate and inside the metallic ring;
an optical semiconductor element located on the multilayer ceramic substrate, inside the metallic ring, and electrically connected to the electrode;
a metallic cap with a window, wherein
the metallic cap is joined to the metallic ring and covers the optical semiconductor element, and
the metallic ring is thicker than the electrode; and
an internal heat sink located on the multilayer ceramic substrate and inside the metallic ring, wherein the optical semiconductor element is located on the internal heat sink, and
an inner end of the metallic ring is in contact with the internal heat sink.

8. The semiconductor package according to claim 7, further comprising an external heat sink joined to an outer end of the metallic ring.

9. The semiconductor package according to claim 7, wherein an outer end of the metallic ring is flush with an outer end of the multilayer ceramic substrate.

\* \* \* \* \*